(12) United States Patent
Tsui et al.

(10) Patent No.: US 11,538,920 B2
(45) Date of Patent: Dec. 27, 2022

(54) METHOD FOR INCREASING AN OXIDE THICKNESS AT TRENCH CORNER OF AN U-SHAPED GATE METAL-OXIDE-SEMICONDUCTOR FIELD-EFFECT TRANSISTOR

(71) Applicant: National Chiao Tung University, Hsinchu (TW)

(72) Inventors: Bing-Yue Tsui, Hsinchu (TW); Fang-Hsin Lu, Taoyuan (TW); Yi-Ting Shih, Taichung (TW)

(73) Assignee: NATIONAL CHIAO TUNG UNIVERSITY, Hsinchu (TW)

( * ) Notice: Subject to any disclaimer, the term of this patent is extended or adjusted under 35 U.S.C. 154(b) by 184 days.

(21) Appl. No.: 17/161,951

(22) Filed: Jan. 29, 2021

(65) Prior Publication Data

US 2022/0148923 A1 May 12, 2022

(30) Foreign Application Priority Data

Nov. 6, 2020 (TW) ................... 109138841

(51) Int. Cl.
*H01L 29/78* (2006.01)
*H01L 29/423* (2006.01)
*H01L 29/66* (2006.01)

(52) U.S. Cl.
CPC .. *H01L 29/66068* (2013.01); *H01L 29/42368* (2013.01); *H01L 29/66734* (2013.01); *H01L 29/7813* (2013.01)

(58) Field of Classification Search
CPC ........... H01L 29/4236; H01L 29/42368; H01L 29/66734; H01L 29/7813
See application file for complete search history.

(56) References Cited

U.S. PATENT DOCUMENTS

| 4,914,058 A | 4/1990 | Blanchard |
| 2006/0205222 A1* | 9/2006 | In't Zandt ............. H01L 29/513 438/242 |

(Continued)

FOREIGN PATENT DOCUMENTS

| EP | 1302987 A1 * | 4/2003 | ....... H01L 21/28167 |
| JP | 2012-060151 A | 3/2012 | |

(Continued)

OTHER PUBLICATIONS

Aoki et al., "High Performance and Reliability Trench Gate Power MOSFET With Partially Thick Gate Oxide Film Structure (PTOx-TMOS)", Proceedings of the 18th International Symposium on Power Semiconductor Devices & IC's, 2006, pp. 85-88.

(Continued)

*Primary Examiner* — Robert G Bachner
*Assistant Examiner* — Molly K Reida
(74) *Attorney, Agent, or Firm* — Birch, Stewart, Kolasch & Birch, LLP

(57) ABSTRACT

A method for increasing an oxide thickness at trench corner of an UMOSFET is provided, comprising providing an N-type substrate, and forming an N-type drift region, N-type and P-type heavily doped regions and P-type body therein. A trench is defined through lithography, and a pad oxide is formed along the trench through oxidation or deposition process. An oxidation barrier is formed upon the pad oxide. A thermal oxidation process is employed, so a corner oxide is effectively formed at the trench corner. After removing the pad oxide and oxidation barrier, various back-end processes are carried out to complete the transistor structure. The invention is aimed to increase oxide thickness near the trench bottom, and can be applied to high voltage devices, such as SiC. The conventional electric field crowding effect (Continued)

occurring at the trench corner is greatly solved, thus increasing breakdown voltages thereof.

15 Claims, 18 Drawing Sheets
(2 of 18 Drawing Sheet(s) Filed in Color)

(56) References Cited

U.S. PATENT DOCUMENTS

| | | | |
|---|---|---|---|
| 2006/0289929 A1* | 12/2006 | Andrews | H01L 29/66734 438/270 |
| 2007/0045724 A1* | 3/2007 | Lim | H01L 29/66621 257/E21.429 |
| 2009/0315083 A1* | 12/2009 | Pan | H01L 29/66734 257/280 |
| 2012/0146090 A1 | 6/2012 | Lui et al. | |
| 2013/0341708 A1* | 12/2013 | Sumida | H01L 29/0878 438/270 |
| 2014/0175540 A1 | 6/2014 | Bobde et al. | |
| 2017/0200799 A1* | 7/2017 | Amali | H01L 29/6634 |

FOREIGN PATENT DOCUMENTS

| | | |
|---|---|---|
| JP | 2019-033283 A | 2/2019 |
| JP | 2019-040923 A | 3/2019 |
| TW | 201005876 A1 | 2/2010 |
| TW | I512844 B | 12/2015 |
| TW | I538224 B | 6/2016 |

OTHER PUBLICATIONS

Harada et al., "3.3-kV-Class 4H-SiC MeV-Implanted UMOSFET With Reduced Gate Oxide Field", IEEE Electron Device Letters, vol. 37, No. 3, Mar. 2016, pp. 314-316.

Kojima et al., "Self-aligned formation of the trench bottom shielding region in 4H-SiC trench gate MOSFET", Japanese Journal of Applied Physics, vol. 55, 04ER02, 2016, 4 pages.

Nakamura et al., "High Performance SiC Trench Devices with Ultra-low Ron", Proc. IEEE Int. Electron Devices Meeting (IEDM), 2011, pp. 599-601.

Saitoh et al., "4H-SiC V-Groove Trench MOSFETs with the Buried $p^+$ Regions", SEI Technical Review, No. 80, Apr. 2015, pp. 75-80.

Shih, Yi-Ting, "Process and Characterization of 4H-SiC UMOSFET with Thick Bottom Oxide", National Chiao Tung University, Dec. 3, 2020, 2 pages.

Takaya et al. "A 4H-SiC Trench MOSFET with Thick Bottom Oxide for Improving Characteristics", Proceedings of the 25th International Symposium on Power Semiconductor Devices & ICs, Kanazawa, 2013, pp. 43-46.

Yen et al., "A Novel Process to Fabricate 4H-SiC UMOSFET with Thick Bottom Oxide (TBOX) at Trench Bottom", International Electron Devices and Materials Symposia (IEDMS) 2019, Oral A3-4, 1 page.

* cited by examiner

METHOD FOR INCREASING AN OXIDE THICKNESS AT TRENCH CORNER OF AN U-SHAPED GATE METAL-OXIDE-SEMICONDUCTOR FIELD-EFFECT TRANSISTOR

This application claims priority of Application No. 109138841 filed in Taiwan on 6 Nov. 2020 under 35 U.S.C. § 119; the entire contents of all of which are hereby incorporated by reference.

BACKGROUND OF THE INVENTION

Field of the Invention

The present invention relates to process manufacturing techniques of an U-shaped gate metal-oxide-semiconductor field-effect transistor. More particularly, it is related to a manufacturing method for increasing an oxide thickness at trench corner of an U-shaped gate metal-oxide-semiconductor field-effect transistor.

Description of the Prior Art

In general, an U-shaped gate metal-oxide-semiconductor field-effect transistor (UMOSFET) is a kind of high-voltage metal-oxide-semiconductor field-effect transistor (HV MOSFET) which has small cell pitch, and thus makes an UMOSFET a semiconductor device with the low specific on-resistance. FIG. 1 shows a schematic diagram of a basic structure of a conventional N-type UMOSFET in the prior art. As shown, when a gate voltage is applied to the gate 10 and the gate voltage is sufficient to generate an inversion layer at the interface between the p-type substrate 12 and the gate oxide layer 13, that is, the gate voltage is greater than a threshold voltage for the transistor to operate, under such condition, electrons will flow from the N+ source 14 in the upper place into the channel of the inversion layer, then enter the N− drift region 15 and finally reach the N+ drain 16 at its back end. In general, in order to form a complete channel, the trench depth of the gate 10 must exceed the p-type substrate 12 and enter the N-drift region 15.

In view of the trending developments of the existing technologies, since silicon carbide (SiC) has a wider energy band and a higher breakdown voltage than silicon does, the UMOSFET which is made of silicon carbide, comparatively sustain ten times as large breakdown strength as the UMOSFET which is made of silicon does. Therefore, it achieves to sustain grandly high breakdown voltages with low impedance and thin drift layer. However, it draws our attention that, when a large voltage is applied to the drain, the effect of electric field crowding often occurs on both sides of its gate bottom of the transistor due to less radius of curvature on both sides of the gate bottom, as can be seen in the dotted-line region shown in FIG. 2. In addition, for SiC devices, the wafer usually takes the (0001) crystal plane as its commonly used front side, and the (11-20) crystal plane as its trench sidewall. Normally, the electron mobility along the (11-20) crystal plane will be much higher than the electron mobility along the (0001) crystal plane, so that the transistor can have a lower on-resistance. Nevertheless, it is known that the thermal oxidation rate of the (0001) crystal plane is much lower than that of the (11-20) crystal plane. If the gate oxide layer of the transistor is formed by thermal oxidation, the thickness at the trench bottom will be thinner than the thickness at its sidewall. Moreover, taking consideration into the electric field enhancement effect at the corners on both sides of the trench bottom as illustrated in FIG. 2, then the transistor will be very likely to fail due to its gate oxide breakdown. So far, there has been related technologies being proposed, which perform to control the chemical vapor deposition process parameters so as to make the deposition rate on the sidewall less than the deposition rate on its bottom. By doing so, the bottom oxide layer can be controlled to be thicker than the sidewalls. However, the electric field enhancement effect at the corners on both sides of the trench bottom still cannot be avoided, so the breakdown voltage of the transistor is still limited by breakdown of its gate oxide layer.

Based on these issues to be solved, another prior art, as indicated in FIG. 3, proposes to use and dispose a P-type region 31 in the N-drift region 30, which is configured to be close to the bottom of the gate 32, and thus forms a depletion area by the p-n junction to deplete the trench bottom for reducing the electric field of the gate oxide layer. However, when the transistor is turned on, the depletion area formed by the p-n junction will also be an obstacle to its current flow, causing the JFET effect, thereby increasing the on-resistance of the device accordingly. Therefore, such method still has unavoidable issues to be solved. And yet, another prior art proposes to use a silicon dioxide to fill the trench first, after the trench is formed by etching. Afterwards, a chemical mechanical polishing (CMP) process is then employed to remove the silicon dioxide, which is located outside the trench. Later, for the remaining silicon dioxide which is located in the trench, a dry etching process is employed to etch the silicon dioxide in the trench, and merely leaves silicon dioxide of expected thickness as required. However, such method must be involved with a high-cost CMP process. Moreover, the thickness of the oxide layer at the bottom of the trench is also difficult to control precisely, and thus, cannot be brought into actual mass production stage.

And yet, another prior art proposes to use ion implantation to make amorphous silicon carbide at the bottom of the trench so as to increase its oxidation rate, and hopefully, to grow a thicker oxide layer by thermal oxidation. However, it is worth noticing that the oxidation temperature of such method is lower than the temperature required for the recrystallization of the silicon carbide. Therefore, it is very likely that defects will remain in the device structure and affect the performance of the device. As a result, it is believed that such method still fails to be practically applied.

Therefore, on account of above, to overcome the above-mentioned problems, it should be obvious that there is indeed an urgent need for the professionals in the field for proposing a new manufacturing method to be developed that can effectively solve the above mentioned problems occurring in the prior design. And by using such manufacturing method, the oxide thickness at corners of the trench bottom of an UMOSFET can be effectively increased and those long-standing shortcomings in the prior arts can be successfully solved. Hereinafter, the detailed specific implementations will be fully described in the following paragraphs.

SUMMARY OF THE INVENTION

In order to overcome the above mentioned disadvantages, one major objective in accordance with the present invention is provided for a manufacturing method for increasing an oxide thickness at trench corner of an U-shaped gate metal-oxide-semiconductor field-effect transistor. By employing the proposed method of the invention, the oxide thickness at the trench corners of an UMOSFET can be effectively controlled in a better way, and the oxide thickness near the bottom of the trench sidewall can be increased without affecting a gate oxide thickness. Therefore, the electric field intensity within the oxide layer can be significantly lowered, and thus improve the breakdown voltages under the same given voltages being applied.

For achieving the above mentioned objectives, the technical solutions of the present invention are aimed to provide a method for increasing an oxide thickness at trench corner of an UMOSFET, comprising following steps.

(a): an N-type semiconductor substrate is provided, and an N-type drift region is formed on the N-type semiconductor substrate.

(b): an N-type heavily doped region is formed in the N-type drift region.

(c): a first P-type heavily doped region and a second P-type heavily doped region are respectively formed on opposite sides of the N-type heavily doped region, and a P-type body region is formed between the N-type heavily doped region, the first P-type heavily doped region, the second P-type heavily doped region and the N-type drift region.

(d): an etch hardmask layer is deposited on the N-type heavily doped region, the first P-type heavily doped region and the second P-type heavily doped region, and a trench is formed by using a lithography process. According to the embodiment of the present invention, the trench extends through the N-type heavily doped region and the P-type body region, and a bottom of the trench ends in the N-type drift region.

(e): a pad oxide is formed along two opposite sidewalls and a bottom of the trench, wherein a corner is correspondingly formed between each of the two opposite sidewalls and the bottom. According to the embodiment of the present invention, the pad oxide can be formed on the two opposite sidewalls and the bottom of the trench by using either an oxidation process or a deposition process. In addition, a thickness of the pad oxide can be between 0 and 100 nm.

(f): an oxidation barrier is provided on the pad oxide and a thermal oxidation process is performed, such that a corner oxide is formed at the corner of the trench by the thermal oxidation process. According to the embodiment of the present invention, the oxidation barrier can be made of silicon nitride ($Si_3N_4$), aluminum oxide ($Al_2O_3$), or aluminum nitride (AlN). And, a thickness of the oxidation barrier is between 50 and 300 nm.

Furthermore, the parameters and conditions for performing the proposed thermal oxidation process comprise setting the process temperature between 900 and 1300 Celsius degrees, controlling the process time between 10 and 600 minutes, and using oxygen ($O_2$), water molecule ($H_2O$), or a mixture of hydrogen ($H_2$) and oxygen ($O_2$) in the thermal oxidation process. Therefore, when the thermal oxidation process is being applied for growing the corner oxide, a thickness of the corner oxide is between 50 and 100 nm. In general, various modifications and variations to the present invention can be made by people who are skilled in the art, without departing from the scope or spirits of the invention. And yet, the present invention covers these modifications and/or variations provided that, they fall within the scope of the invention and its equivalent. The present invention is certainly not limited to the disclosed parameters and conditions as illustrated above.

(g): the pad oxide and the oxidation barrier are removed, and a gate oxide forming process is performed to generate a gate oxide, wherein the gate oxide forming process may comprise, and yet not limited to a high temperature oxidation process, a chemical vapor deposition, and so on for generating the gate oxide. The gate oxide is formed along the two opposite sidewalls and the bottom of the trench and in connection with the above mentioned corner oxide.

(h): a gate conductive layer is formed in the trench and a dielectric layer is further deposited on the gate conductive layer.

According to the embodiment of the present invention, the gate conductive layer is formed by using a low-pressure chemical vapor deposition (LPCVD) process first, to deposit a polysilicon as a gate material. And, subsequently using an etch back process to etch back the polysilicon, so as to form the gate conductive layer.

(i): at least one contact window is formed, which extends through the dielectric layer and the etch hardmask layer, and electrically connected to the N-type heavily doped region, the first P-type heavily doped region, and the second P-type heavily doped region for providing electrical paths.

Preferably, according to one embodiment of the present invention, the material for forming the semiconductor substrate can be silicon carbide, such that the corner oxide is formed by oxidation of the silicon carbide at the corner of the trench through the thermal oxidation process. In one embodiment, the corner oxide is made of silicon dioxide ($SiO_2$), and a thickness of the corner oxide is between 50 and 100 nm.

To sum above, it is apparent that, the present invention mainly discloses an UMOSFET structure having increased oxide thickness at bottoms of its trench sidewalls and the manufacturing method for fabricating such an UMOSFET structure. According to the process techniques disclosed by the present invention, the thick oxide layer (i.e. the corner oxide) which grows at the trench sidewall bottoms is formed by a high-temperature thermal oxidation process using an oxidation barrier for covering its sidewalls, such that oxygen-containing molecules can diffuse into the gap between the oxidation barrier and the silicon carbide from the bottom of the oxidation barrier, and reacts with the silicon carbide to form silicon dioxide. As a result, the present invention achieves to effectively increase the oxide thickness at the bottom of the trench sidewalls and enhance the breakdown voltages without affecting its gate oxide thickness. Furthermore, a gate-to-drain capacitance of the transistor can also be reduced.

The applicants emphasize and assert that, the foregoing embodiments of the present invention are described with silicon carbide, merely for an illustrative example as to enable those skilled in the art to fully understand the technical features of the present invention and are not intended to limit the application of the present invention. In other words, the process method disclosed in the present invention can also be further applied to various semiconductor materials, and not limited to silicon carbide substrates.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

The patent or application file contains at least one color drawing. Copies of this patent or patent application publication with color drawing will be provided by the USPTO upon request and payment of the necessary fee.

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
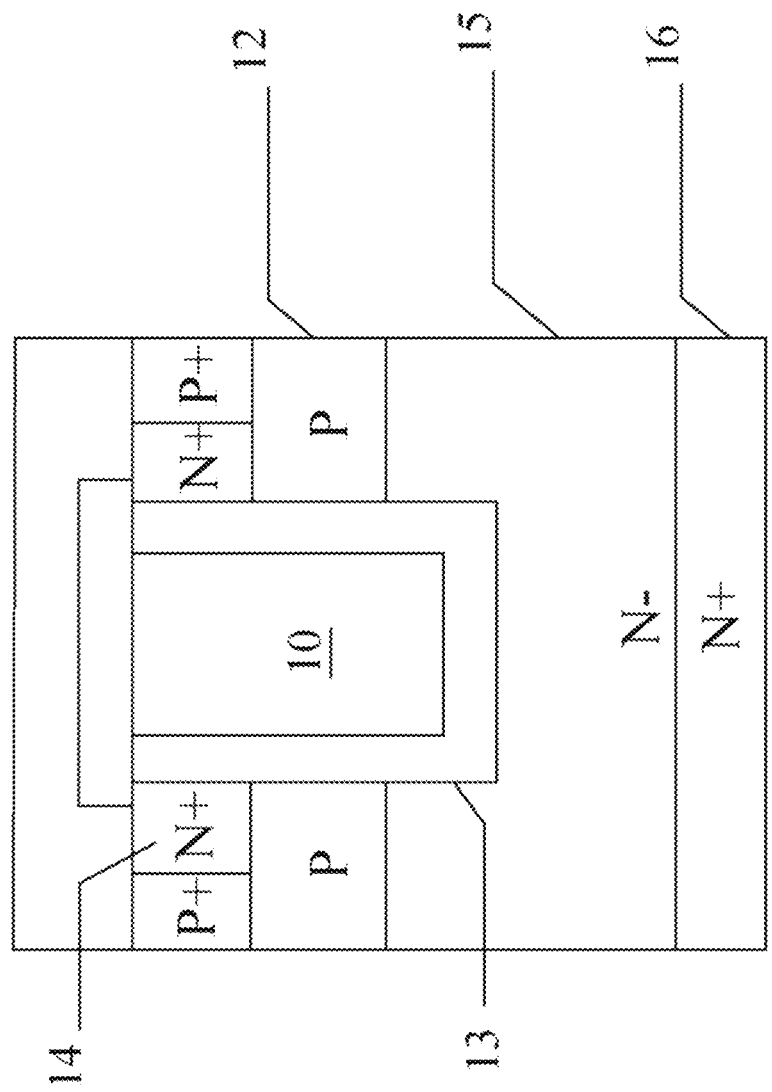
FIG. 1 shows a schematic structural diagram of a basic structure of a conventional N-type UMOSFET in the prior art.

Reference will now be made in detail to the preferred embodiments of the present invention, examples of which are illustrated in the accompanying drawings. Wherever possible, the same reference numbers are used in the drawings and the description to refer to the same or like parts.

The embodiments described below are illustrated to demonstrate the technical contents and characteristics of the present invention and to enable the persons skilled in the art to understand, make, and use the present invention. However, it shall be noticed that, it is not intended to limit the scope of the present invention. Therefore, any equivalent modification or variation according to the spirit of the present invention is to be also included within the scope of the present invention.

Figure 4A:
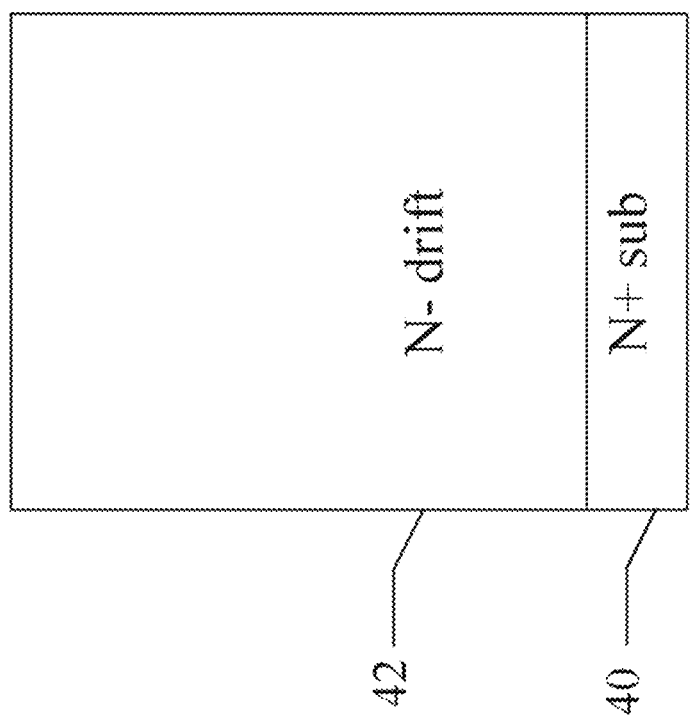
FIG. 4A shows a schematic structural diagram of forming an N-type drift region on an N-type semiconductor substrate in accordance with one embodiment of the present invention.

In view of the various deficiencies disclosed by the above mentioned prior arts, the present invention is aimed to provide a method for increasing an oxide thickness at trench corner of an U-shaped gate metal-oxide-semiconductor field-effect transistor (UMOSFET). Please refer to FIG. 4A to FIG. 4K, which accompanying show schematic cross-sectional views of the structure of an UMOSFET by employing the proposed method disclosed in the present invention. First, please refer to FIG. 4A, wherein an N-type semiconductor substrate (shown as N+ sub) 40 is provided, and an N-type drift region (shown as N− drift) 42 is formed on the N-type semiconductor substrate 40. In such step, according to one embodiment of the present invention, the N+ substrate preferably, is made of an N-type silicon carbide. And, an N-type silicon carbide epitaxial layer with a doping concentration of $1 \times 10^{16}$ cm$^{-3}$ and a thickness of 5.5 μm is grown on the front side of the substrate, as the N− drift region by epitaxial growth, so as to form the structure as shown in FIG. 4A.

Figure 4B:
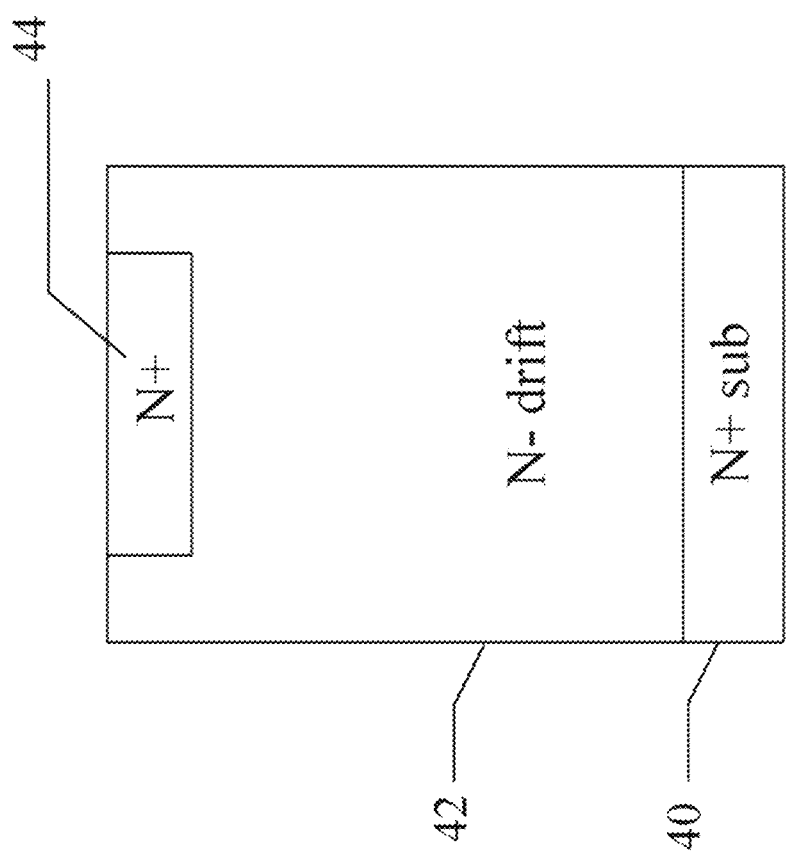
FIG. 4B shows a schematic structural diagram from FIG. 4A after the source ion implantation.
Figure 4C:
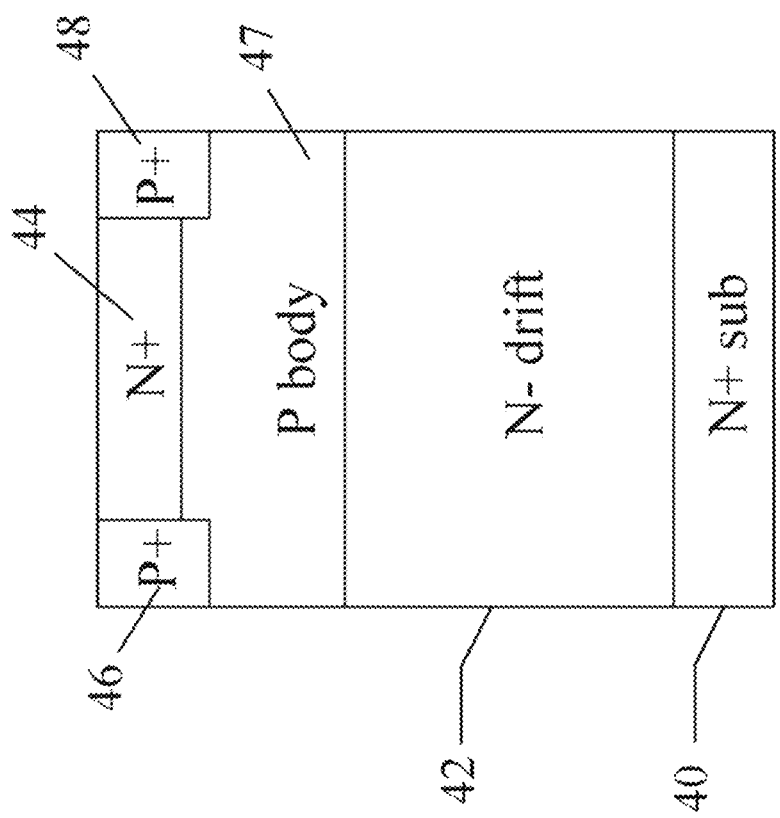
FIG. 4C shows a schematic structural diagram from FIG. 4B, in which an N-type heavily doped region and P-type heavily doped regions are further formed therein.

Then, after RCA cleaning, silicon dioxide is deposited as a barrier layer, also known as a hardmask layer, and a lithography process is employed to define an N+ source window. Subsequently, after the source ion implantation, the hardmask layer is removed and an N-type heavily doped region (shown as N+) 44 in FIG. 4B is formed. Later, the RCA cleaning is performed repeatedly, and the silicon dioxide deposited as a hardmask layer is introduced for defining the P-type heavily doped region (P+) and ion implantation. Later, the hardmask layer is removed, so that a first P-type heavily doped region (P+) 46 and a second P-type heavily doped region (P+) 48 are respectively formed on opposite sides of the N-type heavily doped region 44. Again, use silicon dioxide as a hardmask layer and use lithography process to define a P-type body region window for body ion implantation. Then, remove the hardmask layer, so a P-type body region (P body) 47 is formed between the N-type heavily doped region 44, the first P-type heavily doped region 46, the second P-type heavily doped region 48 and the N-type drift region 42. The structure as shown in FIG. 4C is provided.

Figure 4D:
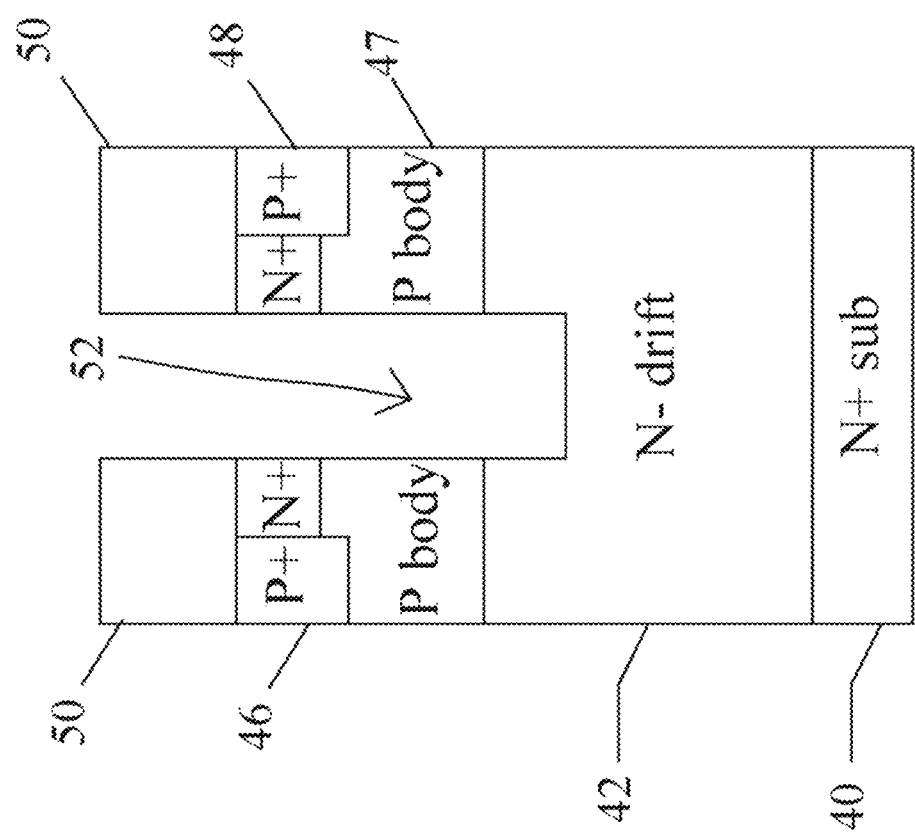
FIG. 4D shows a schematic structural diagram from FIG. 4C after a lithography process is further employed to define a trench region.

Next, as shown in FIG. 4D, an etch hardmask layer 50 is further deposited to serve as a stop layer from etching an area outside the trench gate region of the transistor. A material of the etch hardmask layer 50, for example, can be silicon dioxide (SiO$_2$). The etch hardmask layer 50 is deposited on the N-type heavily doped region 44, the first P-type heavily doped region 46, and the second P-type heavily doped region 48, and a lithography process is then employed to define a trench region, so as to form the trench 52 as shown in the figure.

In details, according to the embodiment of the present invention, the trench 52 extends through the above mentioned N-type heavily doped region 44 and the P-type body region 47, and a bottom of the trench 52 ends in the N-type drift region 42.

Figure 4E:
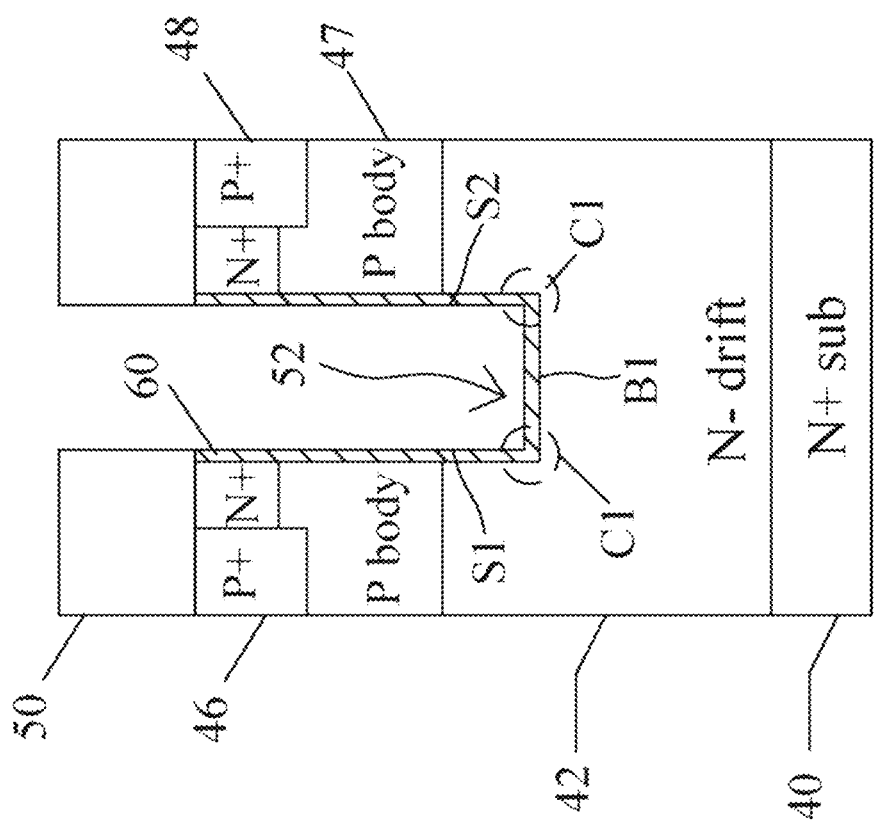
FIG. 4E shows a schematic structural diagram from FIG. 4D after a pad oxide is formed.

Later, as shown in FIG. 4E, the present invention further uses an oxidation process or a deposition process to form a pad oxide 60. As illustrated, the pad oxide 60 is formed along two opposite sidewalls S1, S2 and a bottom B1 of the trench 52. A corner C1 is correspondingly formed between each of the sidewalls S1, S2 and the bottom B1. According to the embodiment of the present invention, a thickness of the pad oxide 60 is between 0 and 100 nanometers (nm). In a preferred embodiment, the pad oxide 60 with a thickness of 10 nm is taken as an illustrative example for describing the technical features of the present invention.

Figure 4F:
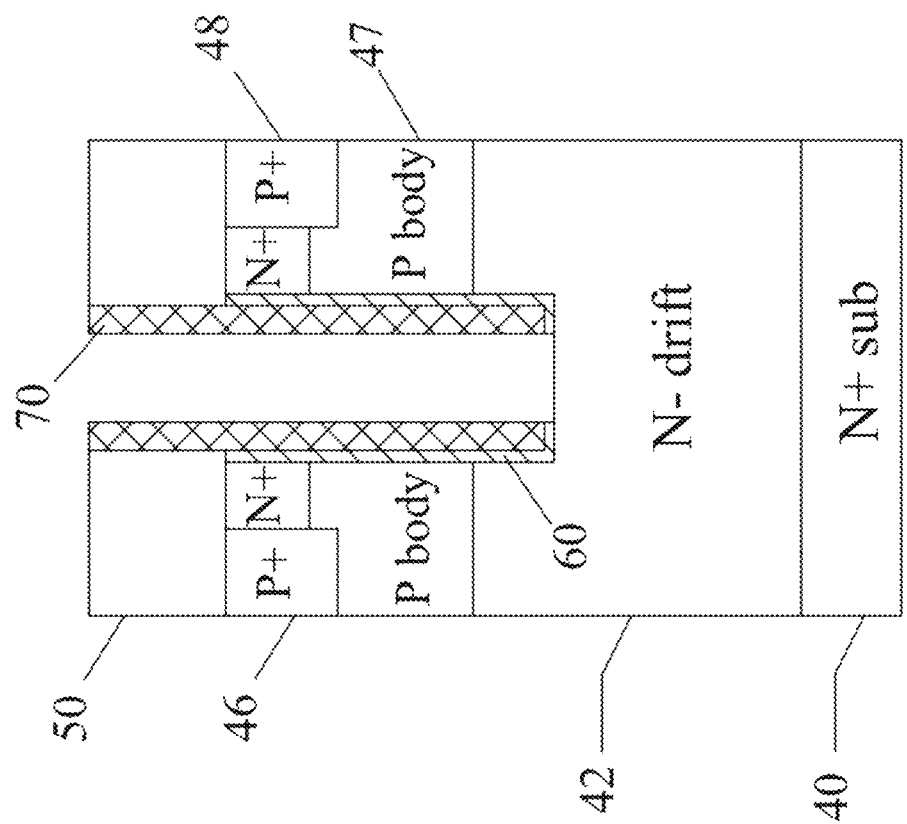
FIG. 4F shows a schematic structural diagram from FIG. 4E, in which an oxidation barrier is further formed upon the pad oxide.

After that, an oxidation barrier is formed upon the pad oxide 60. A material of the oxidation barrier, for example, can be silicon nitride ($Si_3N_4$), aluminum oxide ($Al_2O_3$), aluminum nitride (AlN) or the like. In one embodiment of the present invention, a chemical vapor deposition process, for instance, can be utilized first to deposit the silicon nitride, and then an anisotropic etching process is subsequently employed, so as to form the oxidation barrier 70 as shown in FIG. 4F. Furthermore, according to one embodiment of the present invention, the pad oxide 60 at the bottom of the trench can be selectively removed or remained as required, before the step of providing the oxidation barrier 70. Normally, according to the etch rate of the anisotropic etching process, the pad oxide 60 at the bottom of the trench shown in this embodiment, will be etched along with the anisotropic etching step when forming the oxidation barrier 70. As a result, the oxidation barrier 70 in FIG. 4F is obtained, which covers a small portion of the pad oxide 60 at the bottom of the trench as well as the pad oxide 60 on two sidewalls of the trench. The thickness of the oxidation barrier 70 can be, for example, between 50 and 300 nm. Preferably, the oxidation barrier 70 has a thickness of 100 nm.

Figure 4G:
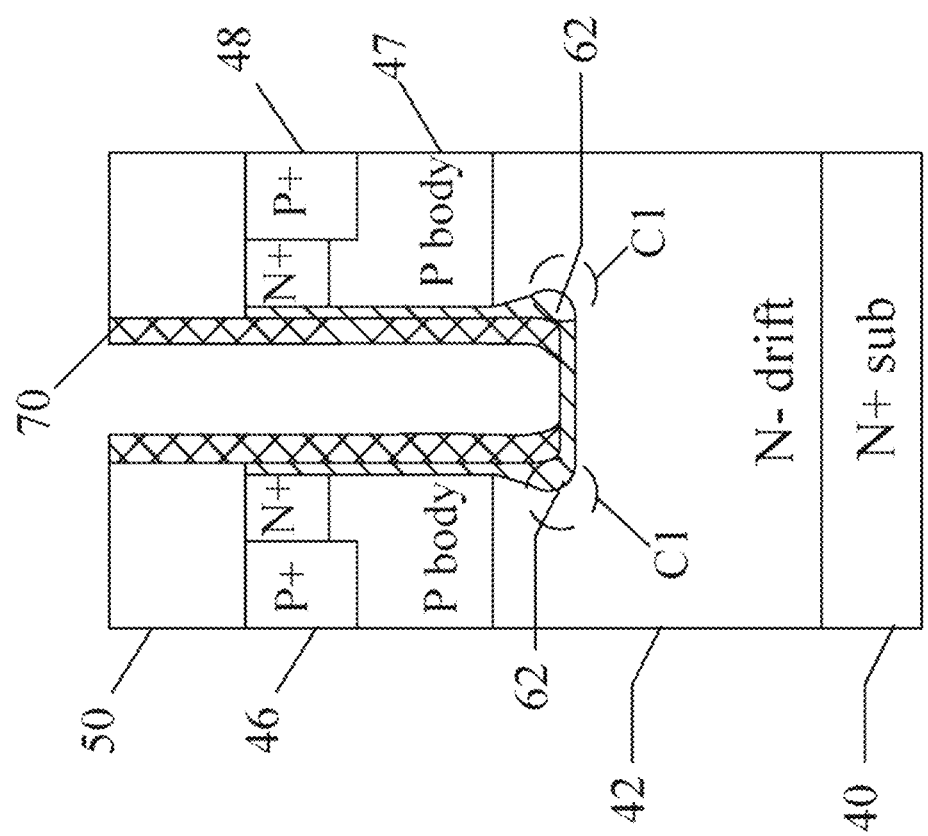
FIG. 4G shows a schematic structural diagram from FIG. 4F, in which a thermal oxidation process is further employed for growing a corner oxide.

Next, please refer to FIG. 4G, in which a thermal oxidation process is then employed such that a corner oxide 62 is effectively formed in the region between the sidewalls and the bottom of the trench (that is, the corners C1) through the thermal oxidation process. Taking one of the embodiments of the present invention as an example, the parameters and conditions for performing the proposed thermal oxidation process comprise setting the process temperature between 900 and 1300 Celsius degrees, controlling the process time between 10 and 600 minutes; and using oxygen ($O_2$), water molecule ($H_2O$), or a mixture of hydrogen ($H_2$) and oxygen ($O_2$). Therefore, when such process is being applied to a silicon carbide substrate, it can be understood that, under the condition of such high-temperature thermal oxidation process, oxygen-containing molecules, such as water molecules ($H_2O$), will be able to diffuse into the gap between the oxidation barrier 70 and the silicon carbide from the bottom of the oxidation barrier 70, such that the silicon carbide at the corners C1 can be oxidized into silicon dioxide ($SiO_2$). For example, a thickness of the corner oxide 62 which is generated by using the proposed to thermal oxidation process, may be between 50 and 100 nm.

Generally, the thickness of the oxide layer at the trench corner C1 (that is, the thickness of the generated corner oxide 62) and its vertical extension height along with the trench sidewall can be adjusted by varying the thickness of the pad oxide 60, the thickness of the oxidation barrier 70, and conditions for performing the foregoing thermal oxidation process, such as process temperature, oxidation time, etc. Certain process flexibility is allowed and practical. It is worth emphasizing that, the present invention is definitely not limited to the above-mentioned thickness, dimensions or process parameters, including process temperature, process time, and reaction gas, etc. which were disclosed in the previously described embodiments. For people who are skilled in the art and with ordinary knowledge in the field, modifications without departing from the spirit of the present invention are permitted. However, within the scope of its equality, such modifications should still fall into the scope and claims of the present invention.

Figure 4H:
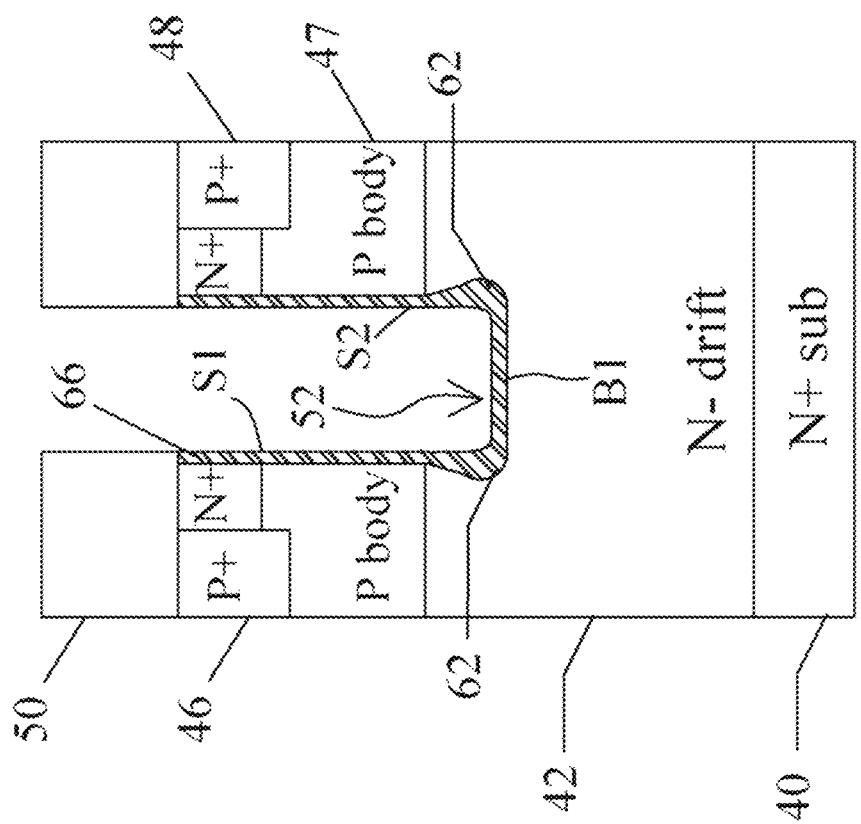
FIG. 4H shows a schematic structural diagram from FIG. 4G, in which a gate oxide forming process is further performed after the pad oxide and the oxidation barrier are removed.

Next, please refer to FIG. 4H, in which the pad oxide 60 and the oxidation barrier 70 are removed. After that, a gate oxide forming process is then carried out to generate a gate oxide 66. According to a few embodiments of the present invention, the gate oxide forming process may comprise, and yet not limited to a high temperature oxidation process, a chemical vapor deposition, and so on for generating the gate oxide 66. In general, the gate oxide 66 is formed along the sidewalls S1, S2 and the bottom B1 of the trench 52 and thus in connection with the corner oxide 62 formed in the previous step, providing the oxide layer region as shown in the figure.

Figure 4I:
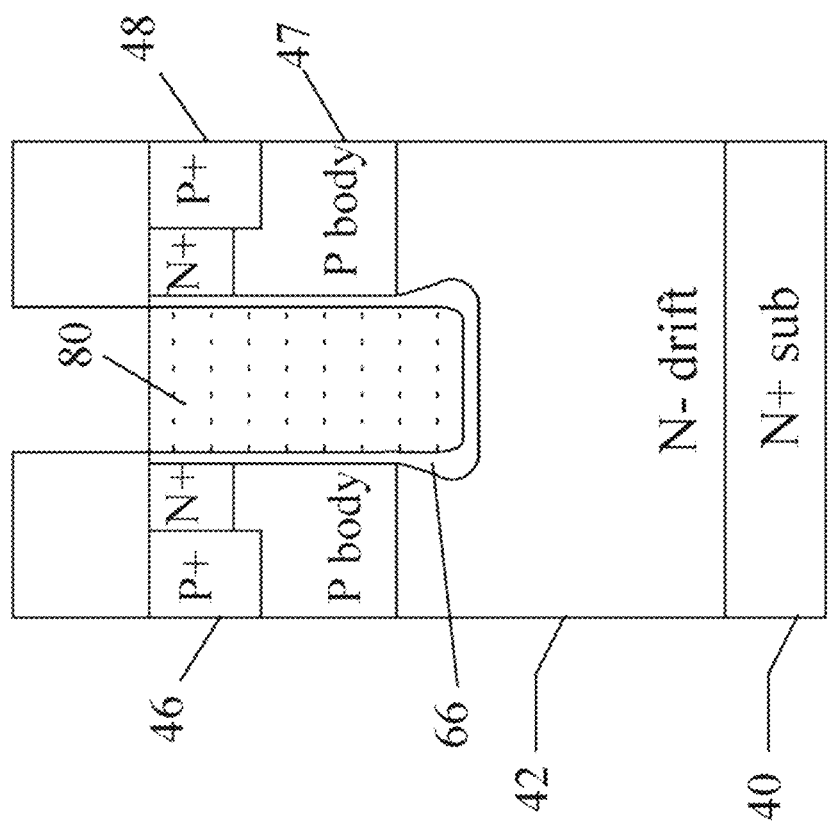
FIG. 4I shows a schematic structural diagram from FIG. 4H, in which a gate conductive layer is further formed in the trench.
Figure 4J:
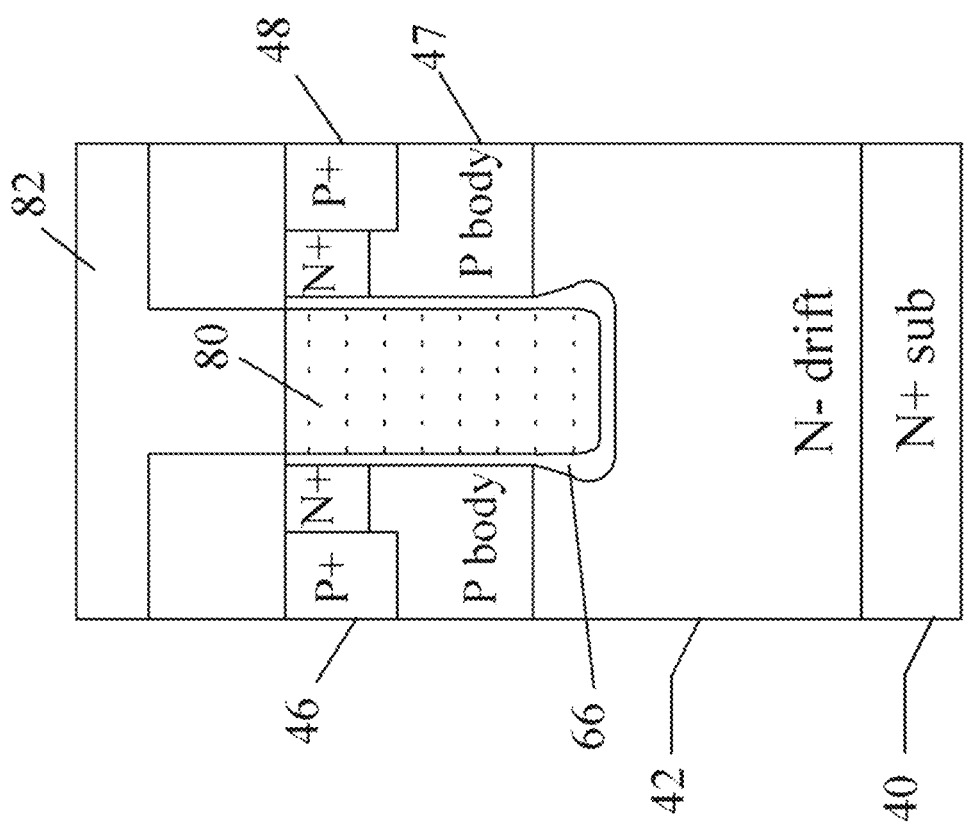
FIG. 4J shows a schematic structural diagram from FIG. 4I, in which a dielectric layer is further deposited on the gate conductive layer.
Figure 4K:
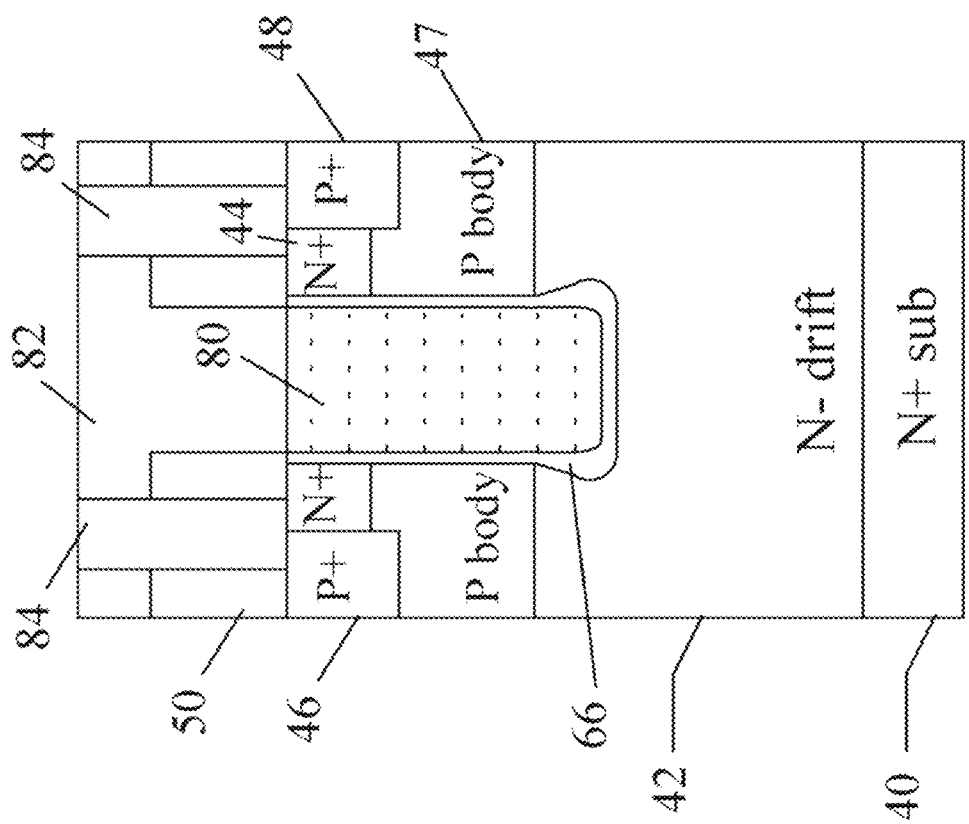
FIG. 4K shows a schematic structural diagram from FIG. 4J, in which at least one contact window is further formed to complete the transistor fabrication.

Next, as shown in FIG. 4I, a gate conductive layer 80 is formed in the trench. According to the embodiment of the present invention, a low-pressure chemical vapor deposition (LPCVD) process is usually firstly used to deposit polysilicon as a gate material in the current UMOSFET manufacturing process. After that, an etch back process is employed to etch back the polysilicon, so as to form the structure of the gate conductive layer 80 as shown in FIG. 4I. Next, as shown in FIG. 4J, a dielectric layer 82 is further deposited on the gate conductive layer 80. Finally, as shown in FIG. 4K, at least one contact window 84 is formed and followed by a plurality of process steps including contact window etching, metal deposition, metal etching, etc., wherein the contact windows 84 extend through the dielectric layer 82 and the etch hardmask layer 50, and electrically connected to the aforementioned N-type heavily doped region 44, the first P-type heavily doped region 46, and the second P-type heavily doped region 48 for providing electrical paths. On the other hand, from another perspective view (not seen in this figure), the polysilicon gate will also need to have alleged metal contacts. Nevertheless, since the configurations are not seen from the cross section of this perspective view of FIG. 4K, and those skilled in the art should be able to implement based on various requirements, redundant descriptions are disregarded herein.

Overall, considering the process steps from FIG. 4H to FIG. 4K including: gate oxidation, gate deposition, dielectric layer deposition, contact window etching, metal deposition, and metal etching, since these steps are mostly the same as they are in a conventional UMOSFET manufacturing process, the present invention is thus not intended to go into details. What is important lies in, the inventive spirit of the present invention focuses on how to increase the oxide thickness at the bottom of the trench sidewall. For this reason, the present invention provides an oxidation barrier ($Si_3N_4$) on the sidewalls of an UMOSFET trench, after the trench is formed. And after that, a high-temperature oxidation process is utilized for the oxide thickness growth at the trench corner of the UMOSFET. As a result, by employing the process method disclosed in the present invention, the bottom of the gate and the corners of the trench can be smoothed, thereby effectively eliminating not only the conventional effect of electric field crowding occurring on the trench sidewalls but also its leading various problems.

Figure 5:
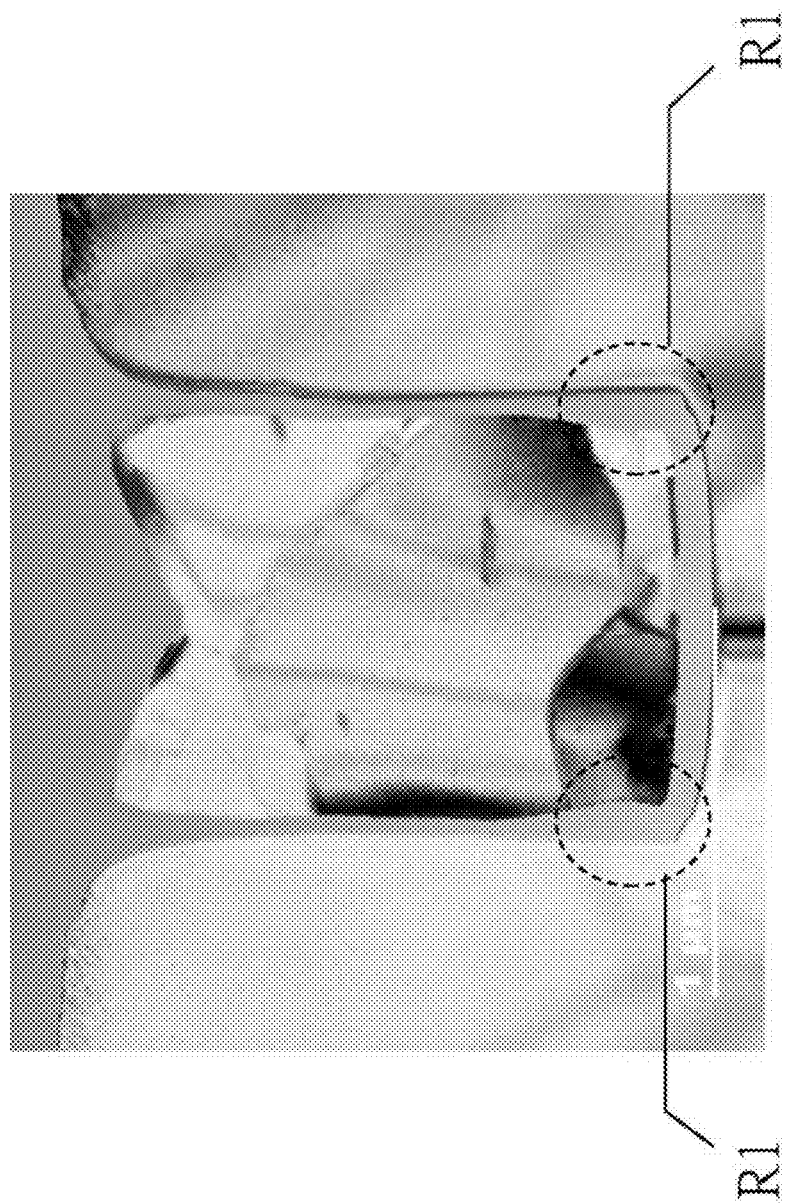
FIG. 5 shows a cross-sectional Transmission Electron Microscopy image of the UMOSFET structure by using the manufacturing method disclosed in the embodiment of the present invention.
Figure 6:
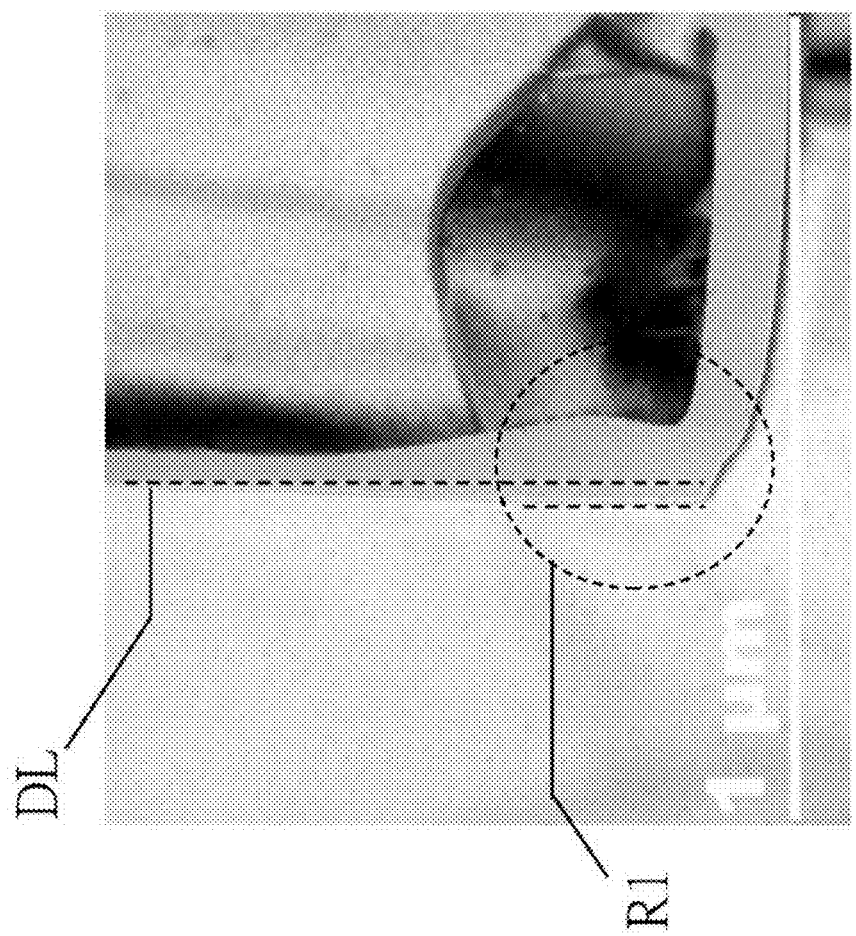
FIG. 6 shows an enlarged portion view of FIG. 5.

In the following, please refer to FIGS. 5 to 6, in which cross-sectional TEM (Transmission Electron Microscopy) images of the UMOSFET structure by using the manufacturing method disclosed in the embodiment of the present invention are provided. FIG. 6 shows an enlarged portion view of FIG. 5. As indicated in the dotted-line region R1, it is obvious to find a much thicker oxide in the region which is close to the bottom of the trench sidewall of the transistor. Also, since additional oxidation process was further applied to the bottom of the trench sidewall and accordingly consumes more silicon carbide, it is observed that, the silicon carbide sidewall will be expanding outward, as illustrated by the dotted line DL in FIG. 6. Therefore, it is quite evident that oxidation indeed occurs at the bottom of the transistor' sidewall. Based on these proofs and the actual TEM images provided in FIGS. 5-6, it is believed that the objective of increasing the oxide thickness at trench corners of an UMOSFET is achieved through utilizing the process steps disclosed in the present invention.

Moreover, in the following paragraphs the applicants further provide simulations of electric field distribution of the trench sidewall at a drain voltage of 600V, to compare the present invention with a conventional UMOSFET. And, by the simulation results, it is proven that the conventional electric field crowding effect can be successfully suppressed on account of increasing the thickness of the corner oxide at the trench bottom of the invention.

Figure 2:
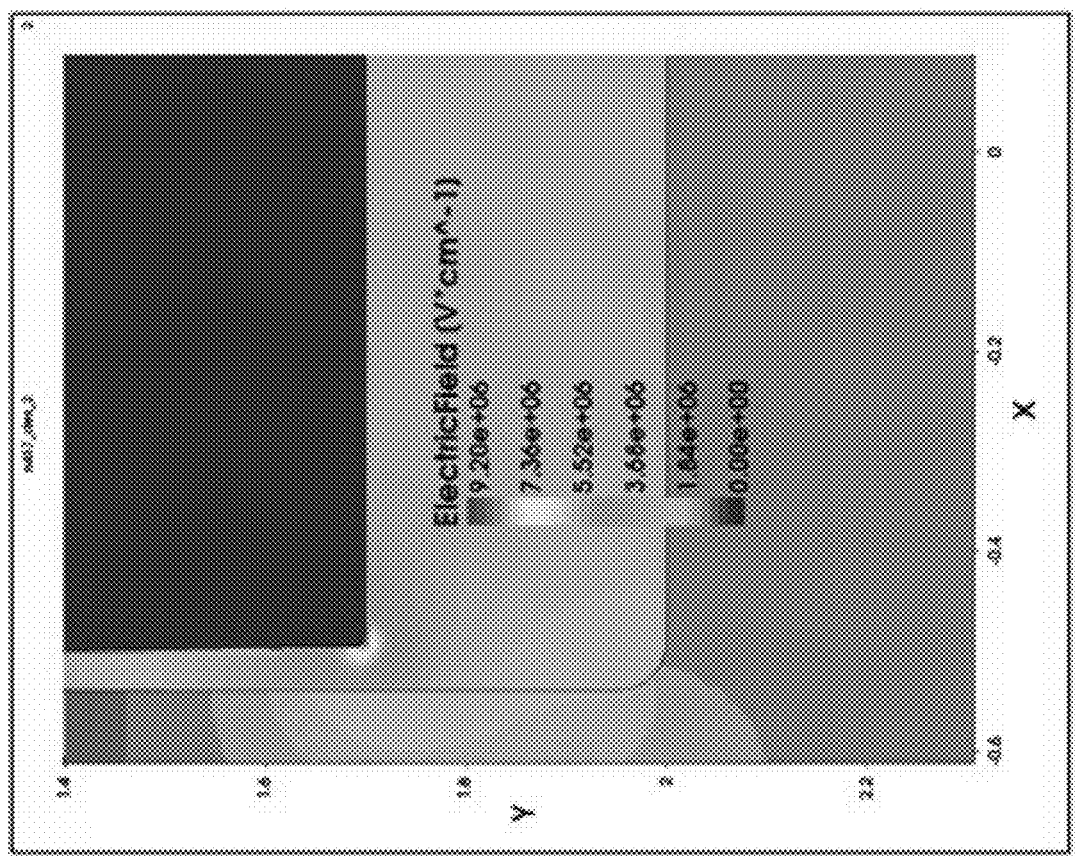
FIG. 2 shows a conventional electric field distribution diagram of trench sidewalls of an UMOSFET in the prior art.
Figure 3:
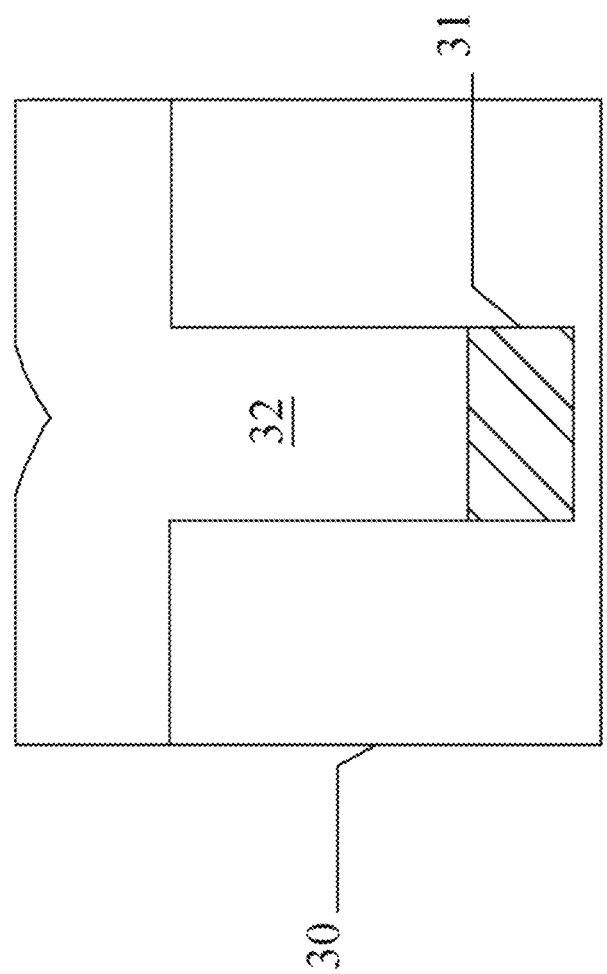
FIG. 3 shows a schematic structural diagram of disposing a P-type region in the bottom of the gate of an UMOSFET in the prior art.
Figure 7:
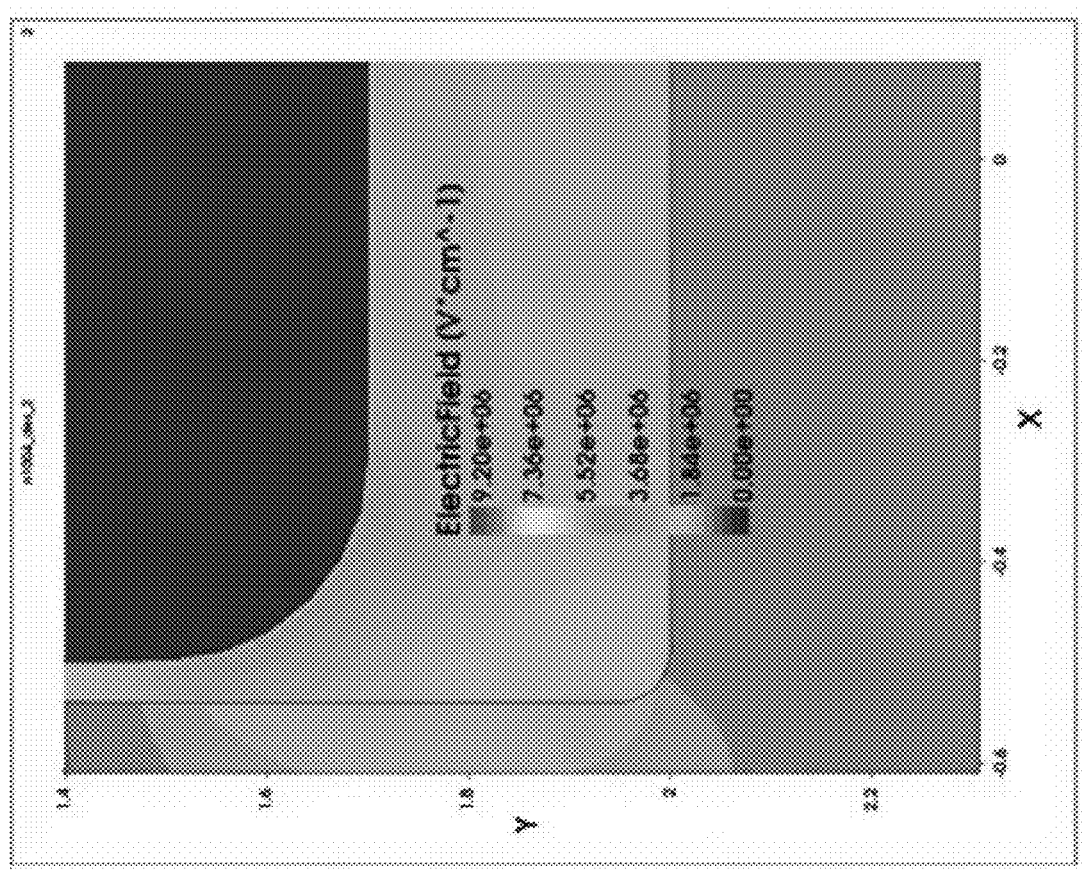
FIG. 7 shows an electric field distribution diagram of the trench sidewall relative to the increase of the corner oxide thickness of the trench.
Figure 8:
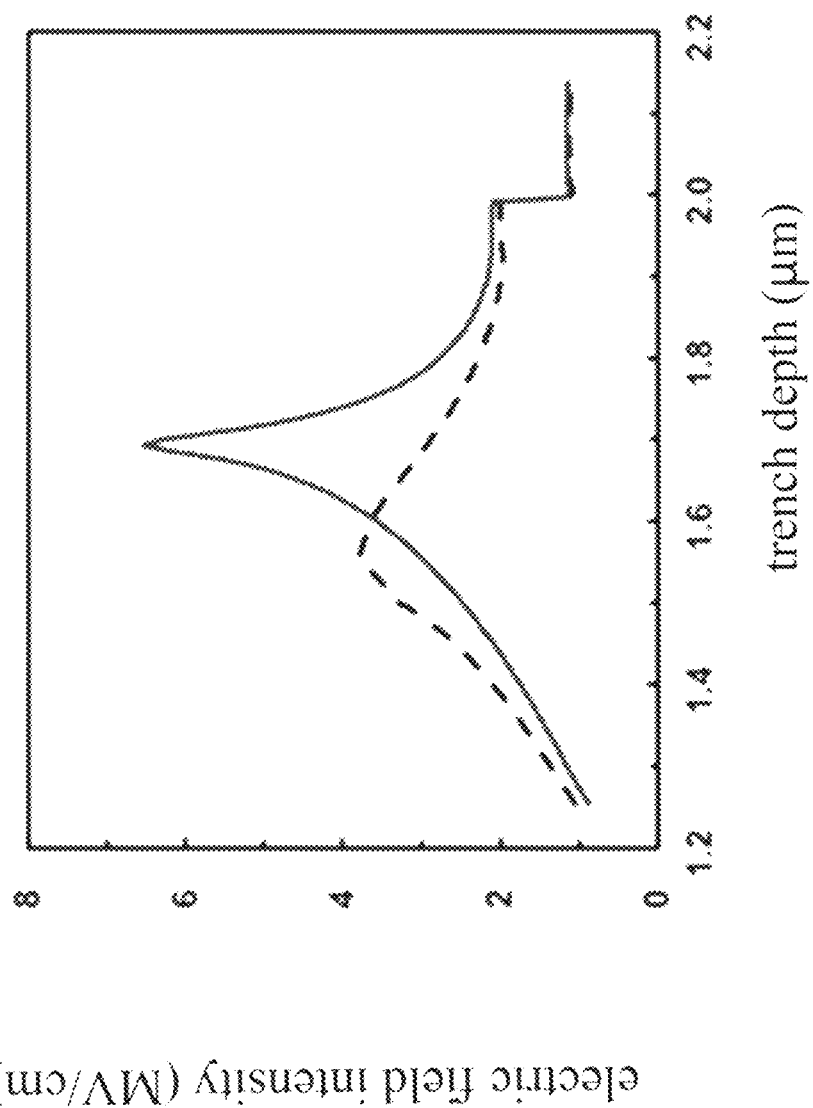
FIG. 8 shows a comparison result of the present invention and the prior art in view of their electric field simulation data.

First, please refer to FIG. 7, which shows an electric field distribution diagram of the trench sidewall relative to the increase of the corner oxide thickness of the trench. Compared with the prior art in FIG. 2, it can be clearly observed that, when the corner oxide thickness of the trench increases, the electric field distribution at the bottom of the gate and at the corners of the trench can be smoothed. And thus, the electric field intensity at the trench sidewall is lower and relatively uniform. In addition, FIG. 8 shows a comparison result of the present invention and the prior art in view of their electric field simulation data. As shown, the electric field simulation data of the conventional UMOSFET in the prior art in FIG. 2 is indicated by the solid line. And, the electric field simulation data of the SiC UMOSFET which is fabricated by using the proposed method in the present invention is indicated by the dashed line. From the comparison result of the two-dimensional electric field distributions, it is apparent that the present invention performs to successfully reduce the electric field intensity of the trench sidewall and achieve a maximum electric field reduction of at least 42%.

Therefore, to sum above, it is believed that the present invention proposes an extremely novel process techniques, which take the benefits of the thermal oxidation rate of the (11-20) crystal plane at the trench sidewall being higher than that of the (0001) crystal plane, to effectively increase the oxide thickness near the sidewall bottom of the trench without affecting the gate oxide thickness. By employing the process method disclosed in the present invention, it is effective to reduce the electric field intensity in the oxide layer under a same given voltage and to increase breakdown voltage of the device. Furthermore, a gate-to-drain capacitance of the transistor can also be reduced, making the present invention extremely innovative and practical.

It is worth reminding that the present invention is certainly not limited to the plurality of process parameters as disclosed above in the earlier paragraphs. In other words, those skilled in the art are able to make modifications and variations according to the actual product specifications, with equality based on the contents and spirits of the invention, and yet, still fall into the scope of the invention.

In view of the above, it is believed that, compared with the prior arts, the present invention and process methods being proposed can effectively solve the electric field enhancement and crowding effect occurring at corners on both sides of the trench bottom, thereby avoiding the issues existing in the prior arts. Also, since the present invention can be effectively applied to silicon carbide substrates, and further can be widely applied to various semiconductor materials, the Applicants assert that the present invention is instinct, effective and highly competitive for incoming technologies, industries and researches developed in the future. Meanwhile, the Applicants provide a variety of TEM images, electric field simulation data analysis, and so on to verify that the technical features, means and effects achieved by the present invention are significantly different from the current solutions, and can not be accomplished easily by those who are familiar with the industry. As a result, it is believed that the present invention is indeed characterized by patentability and shall be patentable soon in a near future.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. A method for increasing an oxide thickness at trench corner of an U-shaped gate metal-oxide-semiconductor field-effect transistor (UMOSFET), comprising:

providing an N-type semiconductor substrate and forming an N-type drift region on the N-type semiconductor substrate;

forming an N-type heavily doped region in the N-type drift region;

forming a first P-type heavily doped region, a second P-type heavily doped region respectively on opposite sides of the N-type heavily doped region, and a P-type body region between the N-type heavily doped region, the first P-type heavily doped region, the second P-type heavily doped region and the N-type drift region;

depositing an etch hardmask layer on the N-type heavily doped region, the first P-type heavily doped region and the second P-type heavily doped region, and using a lithography process to form a trench, wherein the trench comprises two opposite sidewalls and a bottom, and an right angle is formed between each of the two opposite sidewalls and the bottom;

forming a pad oxide along the two opposite sidewalls and the bottom of the trench;

providing an oxidation barrier on the pad oxide and performing a thermal oxidation process, wherein the N-type semiconductor substrate is made of an N-type silicon carbide, the N-type silicon carbide adjacent to the right angle of the trench is oxidized to form a corner oxide by the thermal oxidation process, and wherein an oxidation rate of the two opposite sidewalls of the trench is greater than that of the bottom of the trench, such that the right angle of the trench is turned to be smooth due to a formation of the corner oxide;

removing the pad oxide and the oxidation barrier and performing a gate oxide forming process to generate a gate oxide, wherein the gate oxide is formed along the two opposite sidewalls and the bottom of the trench and in connection with the corner oxide;

forming a gate conductive layer in the trench and further depositing a dielectric layer on the gate conductive layer; and forming at least one contact window which extends through the dielectric layer and the etch hardmask layer, and electrically connected to the N-type heavily doped region, the first P-type heavily doped region, and the second P-type heavily doped region for providing electrical paths.

2. The method for increasing an oxide thickness at trench corner of an UMOSFET of claim 1, wherein the corner oxide is made of silicon dioxide ($SiO_2$), and a thickness of the corner oxide is between 50 and 100 nm.

3. The method for increasing an oxide thickness at trench corner of an UMOSFET of claim 1, further comprising using a source ion implantation to form the N-type heavily doped region when forming the N-type heavily doped region in the N-type drift region.

4. The method for increasing an oxide thickness at trench corner of an UMOSFET of claim 1, wherein the etch hardmask layer is made of silicon dioxide.

5. The method for increasing an oxide thickness at trench corner of an UMOSFET of claim 1, wherein the trench extends through the N-type heavily doped region and the P-type body region, and the bottom of the trench ends in the N-type drift region.

6. The method for increasing an oxide thickness at trench corner of an UMOSFET of claim 1, wherein the oxidation barrier is made of silicon nitride ($Si_3N_4$), aluminum oxide ($Al_2O_3$), or aluminum nitride (AlN).

7. The method for increasing an oxide thickness at trench corner of an UMOSFET of claim 1, wherein a thickness of the oxidation barrier is between 50 and 300 nm.

8. The method for increasing an oxide thickness at trench corner of an UMOSFET of claim 1, wherein a thickness of the pad oxide is between 0 and 100 nm.

9. The method for increasing an oxide thickness at trench corner of an UMOSFET of claim 1, wherein the pad oxide is formed on the two opposite sidewalls and the bottom of the trench by using an oxidation process or a deposition process.

10. The method for increasing an oxide thickness at trench corner of an UMOSFET of claim 1, wherein the pad oxide at the bottom of the trench is remained or removed by an anisotropic etching step before providing the oxidation barrier.

11. The method for increasing an oxide thickness at trench corner of an UMOSFET of claim 1, wherein a process temperature of the thermal oxidation process is between 900 and 1300 Celsius degrees.

12. The method for increasing an oxide thickness at trench corner of an UMOSFET of claim 1, wherein a process time of the thermal oxidation process is between 10 and 600 minutes.

13. The method for increasing an oxide thickness at trench corner of an UMOSFET of claim 1, wherein oxygen ($O_2$), water molecule ($H_2O$), or a mixture of hydrogen ($H_2$) and oxygen ($O_2$) is used in the thermal oxidation process.

14. The method for increasing an oxide thickness at trench corner of an UMOSFET of claim 1, when forming the gate conductive layer in the trench, further comprising:
    using a low-pressure chemical vapor deposition (LPCVD) process to deposit a polysilicon; and
    using an etch back process to etch back the polysilicon, so as to form the gate conductive layer.

15. The method for increasing an oxide thickness at trench corner of an UMOSFET of claim 1, wherein the gate oxide forming process comprises one of a high temperature oxidation process and a chemical vapor deposition for generating the gate oxide.

* * * * *